(12) United States Patent
Robinson

(10) Patent No.: US 6,842,129 B1
(45) Date of Patent: Jan. 11, 2005

(54) DELTA-SIGMA ANALOG-TO-DIGITAL CONVERTER

(75) Inventor: Ian Robinson, Venice, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/691,805

(22) Filed: Oct. 22, 2003

(51) Int. Cl.[7] ............................................... H03M 3/00
(52) U.S. Cl. ..................................... 341/143; 341/144
(58) Field of Search ................................ 341/111, 143, 341/155

(56) References Cited

U.S. PATENT DOCUMENTS

| | | | |
|---|---|---|---|
| 4,754,260 A | * 6/1988 | Nelson et al. | 341/111 |
| 5,142,286 A | * 8/1992 | Ribner et al. | 341/143 |
| 5,329,282 A | * 7/1994 | Jackson | 341/143 |
| 5,594,612 A | 1/1997 | Henrion | |
| 5,682,160 A | 10/1997 | Ribner et al. | |
| 5,959,562 A | * 9/1999 | Wiesbauer | 341/143 |
| 6,249,236 B1 | 6/2001 | Lee et al. | |
| 6,346,898 B1 | 2/2002 | Melanson | |
| 6,362,762 B1 | * 3/2002 | Jensen et al. | 341/143 |
| 6,384,761 B1 | * 5/2002 | Melanson | 341/143 |
| 6,414,615 B1 | 7/2002 | Cheng | |
| 6,437,718 B1 | 8/2002 | Oyama et al. | |
| 6,661,362 B2 | * 12/2003 | Brooks | 341/143 |

FOREIGN PATENT DOCUMENTS

WO     WO 02/091581 A2     11/2002

OTHER PUBLICATIONS

Melanson (U.S. Appl. No. 10/219,362), "a method and system of integrating a mismatch noise shaping into the main loop of a delta signal modulator", filed Aug. 15, 2002.*
M. Annovazzi, et al., "A 98dB 3.3V 28mW–per–channel multibit audio DAC in a Standard 0.35um CMOS Technology", p. 1–4, no date.
Galton, Ian, "Delta–Sigma Data Conversion In Wireless Transceivers", IEEE Transactions On Microwave Theory and Techniques, vol. 50, No. 1, Jan. 2002, p. 302–315.

* cited by examiner

Primary Examiner—Jean Bruner Jeanglaude
(74) Attorney, Agent, or Firm—Tarolli, Sundheim, Covell & Tummino L.L.P.

(57) ABSTRACT

Systems and methods are provided for providing feedback to a delta-sigma analog-to-digital converter assembly. A noise shaper preprocesses an analog input signal according to an analog feedback signal and an associated transfer function. A quantizer converts the preprocessed analog input signal into a digital output signal. A delta-sigma modulator shapes noise within a sample of the digital output signal. A digital-to-analog converter converts the shaped digital signal into an analog signal to provide the analog feedback signal.

22 Claims, 5 Drawing Sheets

DELTA-SIGMA ANALOG-TO-DIGITAL CONVERTER

TECHNICAL FIELD

The present invention relates generally to communications systems, and more specifically to analog-to-digital converters.

BACKGROUND OF THE INVENTION

Efforts in the design of integrated circuits for radio frequency (RF) communication systems generally focus on improving performance, reducing cost or a combination thereof. One area of increasing interest relates to conversion of signals, such as from analog-to-digital or digital-to-analog. Both types of conversion have benefited from the development and use of delta-sigma modulation.

Delta-sigma modulation is a technique used to generate a very high fidelity (e.g., low noise) estimate of a signal using a small number of quantization levels and a very high sampling rate. Limiting a signal to a finite number of levels introduces significant "quantization" noise into the system. Oversampling and the use of an integrator feedback-loop in delta-sigma modulation are effective in shifting noise, primarily quantization noise, to out-of-band frequencies. The noise shifting properties enable efficient use of subsequent filtering stages to remove noise and produce a more precise representation of the input.

Using a quantizer with a sample rate much higher than the Nyquist frequency, an analog signal can be sampled numerous times before it can change appreciably. A difference element within the delta-sigma determines a difference between a signal sample and a feedback signal. The determined difference is then passed to an integrator. The negative feedback provided by the feedback signal causes the output of the integrator will be responsive to the degree that its average output over a given period exceeds or falls short of the signal value. The output of the integrator is then quantized, and a feedback signal based on the result is provided to correct the integrator value. A filter can recover the signal value by averaging the quantizer output over a number of cycles. This average will approach the received signal as the sampling rate increases.

It will be appreciated that the feedback signal can be weighted to be somewhat larger than the original signal. This can result in rapid adjustments of the average, causing it to oscillate quickly around the signal value over the course of the averaging process. As the average converges, the magnitude of the swings decreases, but the frequency remains high. Thus, the quantization noise becomes a high frequency oscillation around the average. This high frequency quantization noise can be filtered out to achieve a desired representation of signal having a high dynamic range.

The delta-sigma ADC offers very low quantization noise using quantizers with as small as one bit (e.g., 2 quantization levels). The smaller the quantizer the faster the sample rate to provide a level of performance. To provide very high dynamic range with small, inexpensive quantizers the ADC must be clocked at a very high rate which may require expensive technologies such as Silicon Germanium (SiGe) or Indium Phosphide (InP). Increasing the quantizer size enables performance at lower rates and can avoid the use of more expensive circuit materials but introduces or increases non-linearities in the quantization step and in the feedback converter. These non-linearities can be the limiting factor in ADC performance.

SUMMARY OF THE INVENTION

In accordance with one aspect of the invention, an analog-to-digital converter (ADC) assembly includes a noise shaper, a quantizer, a delta-sigma modulator, and a digital-to-analog converter. The noise shaper preprocesses an analog input signal according to an associated transfer function and an analog feedback signal. The quantizer converts the preprocessed analog input signal into a digital output signal. The delta-sigma modulator shapes noise within a sample of the digital output signal. The digital-to-analog converter (DAC) converts the shaped digital signal into an analog signal to provide the analog feedback signal.

The delta-sigma ADC can be made tunable, such that frequency characteristics of a passband, or band of high dynamic range operation, associated with the ADC can be altered. This can include changing clock rates associated with any of the quantizer and the feedback components (e.g., the delta-sigma modulator and the DAC). The passband can further be altered by changing coefficients of transfer functions associated with either or both of the noise shaper and the delta-sigma modulator.

In accordance with another aspect of the present invention, a method is provided for providing an analog feedback signal in a multi-bit delta-sigma analog-to-digital converter. A first digital signal, having a first word-size, is generated from an analog input signal. The first digital signal is preprocessed to shift quantization noise associated with the signal away from at least one frequency band of interest. The preprocessed first digital signal is quantized into a second digital signal having a second word-size, the first word-size being larger than the second word-size. The second digital signal is converted into an analog signal to provide the analog feedback signal.

DETAILED DESCRIPTION OF INVENTION

The present invention relates to systems and methods for providing linear feedback to a multi-bit delta-sigma analog-to-digital converter (ADC). In accordance with an aspect of the invention, the delta-sigma ADC produces a multi-bit digital signal having a high dynamic range over one or more narrow frequency bands using a quantizer having a relatively low resolution. This is accomplished by preprocessing the analog signal according to a noise shaping transfer function and an analog feedback signal to shift noise associated with the conversion. The ADC output is provided to a feedback loop that generates the analog feedback signal. The feedback loop can include a delta-sigma modulator that quantizes the ADC output into a digital signal having a smaller word size. This word size can be a single bit. The quantized signal is converted to an analog signal to provide the feedback. The ADC can be frequency agile, such that the position and shape of the low-noise frequency bands can be altered in response to input from a central frequency control.

Figure 1:
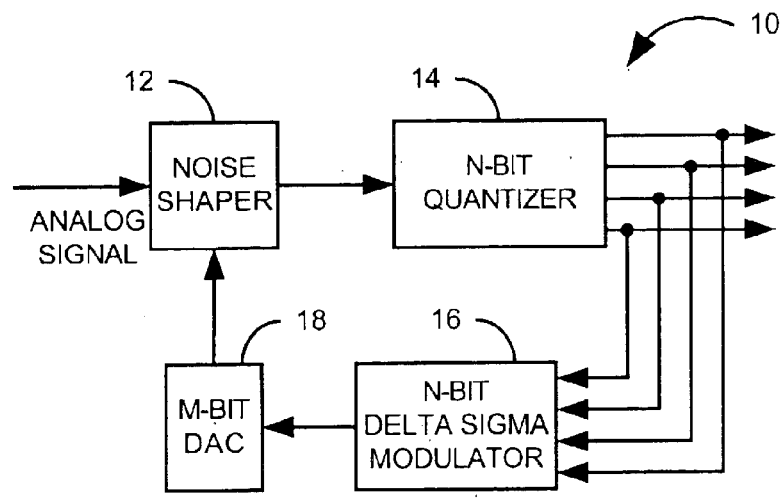
FIG. 1 illustrates a delta-sigma analog-to-digital converter in accordance with an aspect of the invention.

FIG. 1 illustrates a delta-sigma analog-to-digital converter 10 in accordance with an aspect of the invention. An analog input signal is provided to a noise shaper 12. The noise shaper 12 preprocesses the signal as to shift quantization noise from an associated quantizer 14 into unused frequency bands (e.g., do not interfere with wanted signals). The noise shaper 14 can comprise analog circuitry suitable for filtering and preprocessing a signal. For example, the noise shaper can include summers, integrators, quantizers, and interior feedback loops.

The noise shaper 12 creates a plurality of nulls, or low-noise areas, in the quantization noise at the cost of creating concentrations of quantization noise in other portions of the frequency spectrum. The positions of the nulls created by the noise shaper 12 can be determined by changing values within circuits (not shown) associated with the noise shaper 12. Thus, one or more relatively low-noise frequency bands can be selected for output by the noise shaper 12 by altering the circuits associated with the noise shaper 12.

The noise-shaped signal is provided to the quantizer 14. The quantizer 14 creates an oversampled digital representation of the noise-shifted signal having N bits, where N is an integer greater than one. The output of the quantizer 14 can be provided to one or more digital filters (not shown) to remove the shifted quantization noise. The digital signal is provided to a feedback loop as an N-bit digital feedback signal. The N-bit digital feedback signal is input into a delta-sigma modulator 16 as an N-bit digital input at a first sample rate. The delta-sigma modulator 16 translates the N-bit digital input into an M-bit digital output at a second sample rate, where M is a positive integer less than N.

The delta-sigma modulator 16 filters the digital signal as to shift the quantization noise from this translation of the signal into a smaller word size. In an exemplary embodiment, M is equal to one, such that the delta-sigma modulator outputs a single bit output. The use of a single-bit quantizer minimizes the creation of spurious or unwanted signals due to quantizer non-linearity. The output of the delta-sigma modulator is then provided to an M-bit digital-to-analog converter (DAC) 18. The DAC 18 converts the output of the delta-sigma modulator into an analog signal. This analog signal is provided to the noise shaper 12 as a feedback signal.

Figure 2:
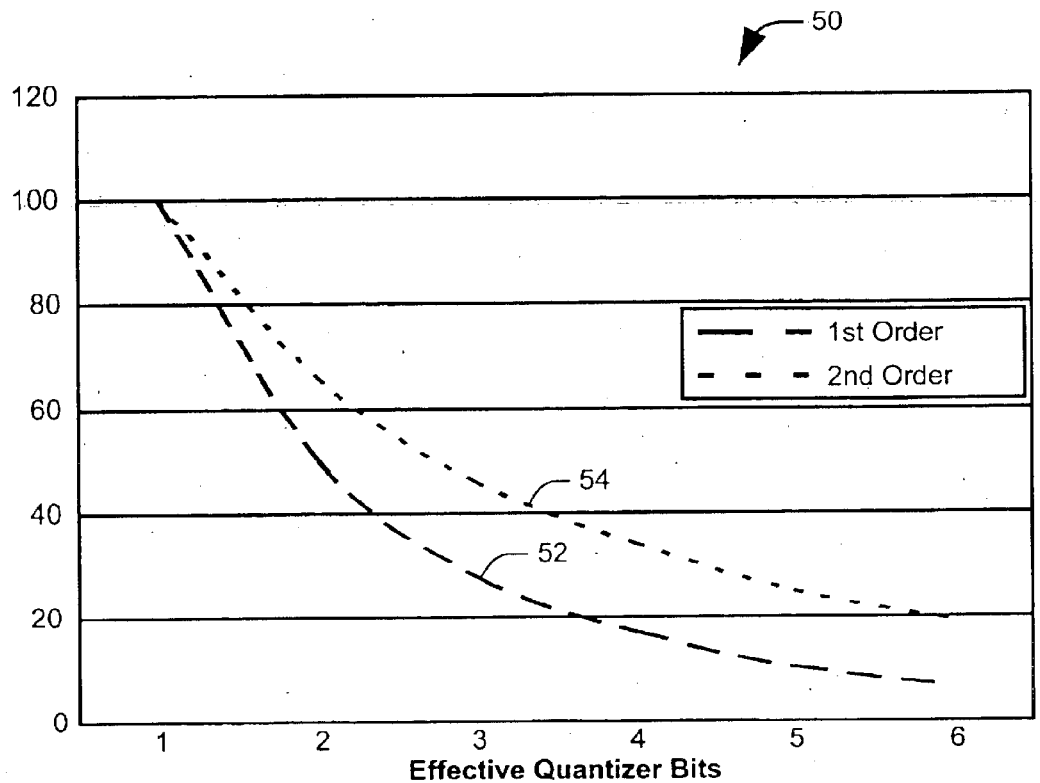
FIG. 2 illustrates a chart of oversampling ratio against effective quantizer bits for an exemplary delta-sigma analog-to-digital converter.

FIG. 2 illustrates a chart 50 of the oversampling ratio necessary to maintain a constant dynamic range as the number of effective quantizer bits are varied within a delta-sigma analog-to-digital converter (ADC). A first line 52, illustrates the oversampling ratio necessary to maintain a desired dynamic range for a signal in a first order delta-sigma modulator, which includes one stage of noise shaping. A second line 54, illustrates the oversampling ratio necessary to maintain a desired dynamic range for a signal in a second order delta-sigma modulator, which includes two stages of noise shaping. The relationship among dynamic range, the order (e.g., number of stages) of the noise shaper, the oversampling ratio, and the number of effective quantizer bits can be expressed as follows:

$$DR = \frac{R^{2L+1}(2L+1)(2^N-1)^2}{\pi^{2L}} \quad \text{Eq. 1}$$

where:
L is the order of the noise shaper;
R is the oversampling ratio;
N is the number of effective bits of the quantizer; and
DR is the dynamic range.

As the chart illustrates, the necessary oversampling rate for a delta-sigma modulator decreases sharply as the effective resolution of its quantizer increases. For the exemplary second order delta-sigma modulator, the necessary oversampling ratio can be reduced by a factor of five when the word-size of the ADC is increased to six bits. For the first order delta-sigma, the gain is more dramatic; the necessary oversampling ratio can be reduced by approximately a factor of sixteen by increasing the word size of the ADC quantizer to six bits.

Thus, when using a multi-bit delta-sigma ADC, the oversampling ratio can be decreased to allow for the use of less expensive circuitry in the ADC. Conversely, the oversampling ratio can be maintained to provide an ADC having an increased dynamic range. It will be appreciated, however, that non-linear behavior within the feedback loop of a delta-sigma analog-to-digital converter can offset the gains achieved by using a multi-bit quantizer. The addition of a delta-sigma modulator to the ADC feedback loop, in accordance with an aspect of the present invention, allows the digital-to-analog conversion in the feedback loop to maintain a linear response without introducing large amounts of quantization noise to the frequency band of interest.

Figure 3:
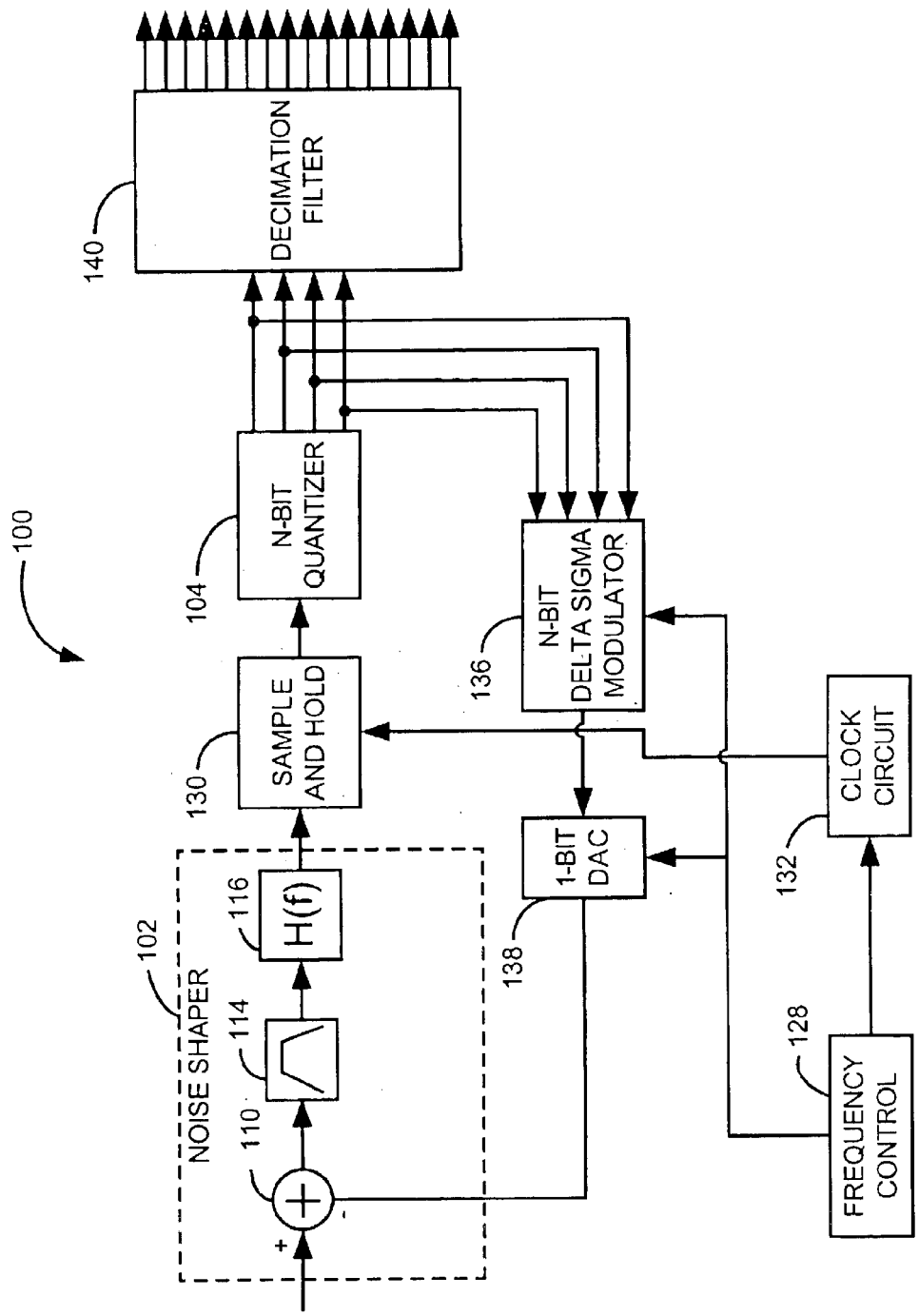
FIG. 3 illustrates an exemplary implementation of a delta-sigma analog-to-digital converter in accordance with an aspect of the invention.

FIG. 3 illustrates an exemplary implementation of a delta-sigma analog-to-digital conversion assembly 100 in accordance with an aspect of the invention. An analog signal is received at a noise shaper 102. The noise shaper 102 can comprise one or more stages, limited only by practical considerations. The noise shaper 102 filters the analog signal as to shape the quantization noise produced by a quantizer 104 into frequencies outside of a band of interest.

The analog signal is received at a difference element 110 that subtracts a feedback signal from the analog signal. The resulting signal is then passed to a tunable/selectable filter 114. The tunable/selectable filter 114 filters the analog signal and passes the filtered signal to a noise shaping filter 116, with transfer function H(f), In the exemplary implementation, the tunable/selectable filter 114 attenuates out-of-band quantization noise introduced by the feedback signal. The tunable/selectable filter 114 can comprise one or more filters, representing multiple passbands of interest. For example, the tunable/selectable filter 114 can comprise a surface acoustic wave (SAW) filter that can be electronically controlled to configure one or more micromechanical components that define its one or more associated passband frequencies. Other tunable or selectable filters having similar frequency agility can be utilized in accordance with one or more aspects of the invention.

The noise shaping filter 116 applies a transfer function to the analog signal that shifts quantization noise to frequencies outside of a frequency band of interest. This creates a high dynamic range (e.g., low noise) frequency band in which a signal can be converter without significant quantization noise. Frequency characteristics associated with the high dynamic range band can be altered by a frequency control 128. In accordance with an aspect of the present invention, values associated with the noise shaping filter 116 can be programmable (e.g., tunable/selectable) such that the values can be altered by a control signal from the frequency control 128. Thus, the width and dynamic range of a particular band can be changed by shifting the placement of one or more low-noise regions created by the delta-sigma modulator. These low noise regions correspond to zeros within the transfer function associated with the noise shaping filter 116. For example, the noise shaping filter 116 can be controlled to increase the dynamic range of a particular high dynamic range region by overlapping multiple zeroes at a particular frequency. It is to be appreciated that the noise shaping filter 116 and other components of the noise shaper 102 can be constructed with discrete time or continuous time circuits, either of which can be made tunable. A sample and hold (S/H) circuit and accordant clock signal are used as needed.

The output of the noise shaper 102 is provided to a sample and hold 130. The sample and hold 130 holds a sample of the shaped signal and provides the sampled signal to the quantizer 104. The sample and hold 130 is operatively connected to a clock circuit 132, such that the output of the noise shaper is sampled at a desired rate. This rate corresponds to a desired output frequency of the ADC 100. In an exemplary embodiment, the clock circuit 132 can be a digital frequency synthesizer. The clock circuit 132 receives control input from the frequency control 128, such that the selected low-noise frequency bands match the desired output frequency. The quantizer 104 receives the samples from the sample and hold 130 and converts them to a multi-bit digital output.

The multi-bit digital input is then provided to a delta-sigma modulator 136 within a feedback loop. The delta-sigma modulator 136 filters and quantizes the multi-bit input to produce a one-bit signal having one or more narrow frequency bands that are substantially free of quantization noise. The delta-sigma modulator 136 receives control input from the frequency control 128 that defines the location of the narrow frequency bands. The frequency control 128 defines the location of the frequency bands of the delta-sigma modulators as to match the frequency bands associated with the tunable/selectable filter 114 and the noise shaper 102. The tunable/selectable filter 114 attenuates any quantization noise outside of its associated frequency created at the digital-to-analog conversion within the feedback loop. It will be appreciated that a frequency agile noise shaper 102 can be implemented without the use of a tunable/selectable filter 114. Careful matching of the frequency characteristics of the feedback loop components and the noise shaper 102 can eliminate the need for the additional filtering provided by the tunable/selectable filter.

The one-bit output from the delta-sigma modulator 136 is provided to a one-bit digital-to-analog converter (DAC) 138. One-bit DAC's are inherently linear in operation, eliminating problems associated with non-linearity within the feedback loop. The output of the one-bit DAC 138 is an analog signal that is provided as feedback to the noise shaper 102.

The multi-bit digital output signal is also provided to a decimation filter 140 that transforms the high sample rate multi-bit output signal into a signal having a lower sample rate, but a larger word size. In the exemplary implementation, the decimation filter 140 can comprise a lowpass filter and a down sampler. The output of the decimation filter 140 is a low noise, high-resolution representation of the original analog input signal.

Figure 4:
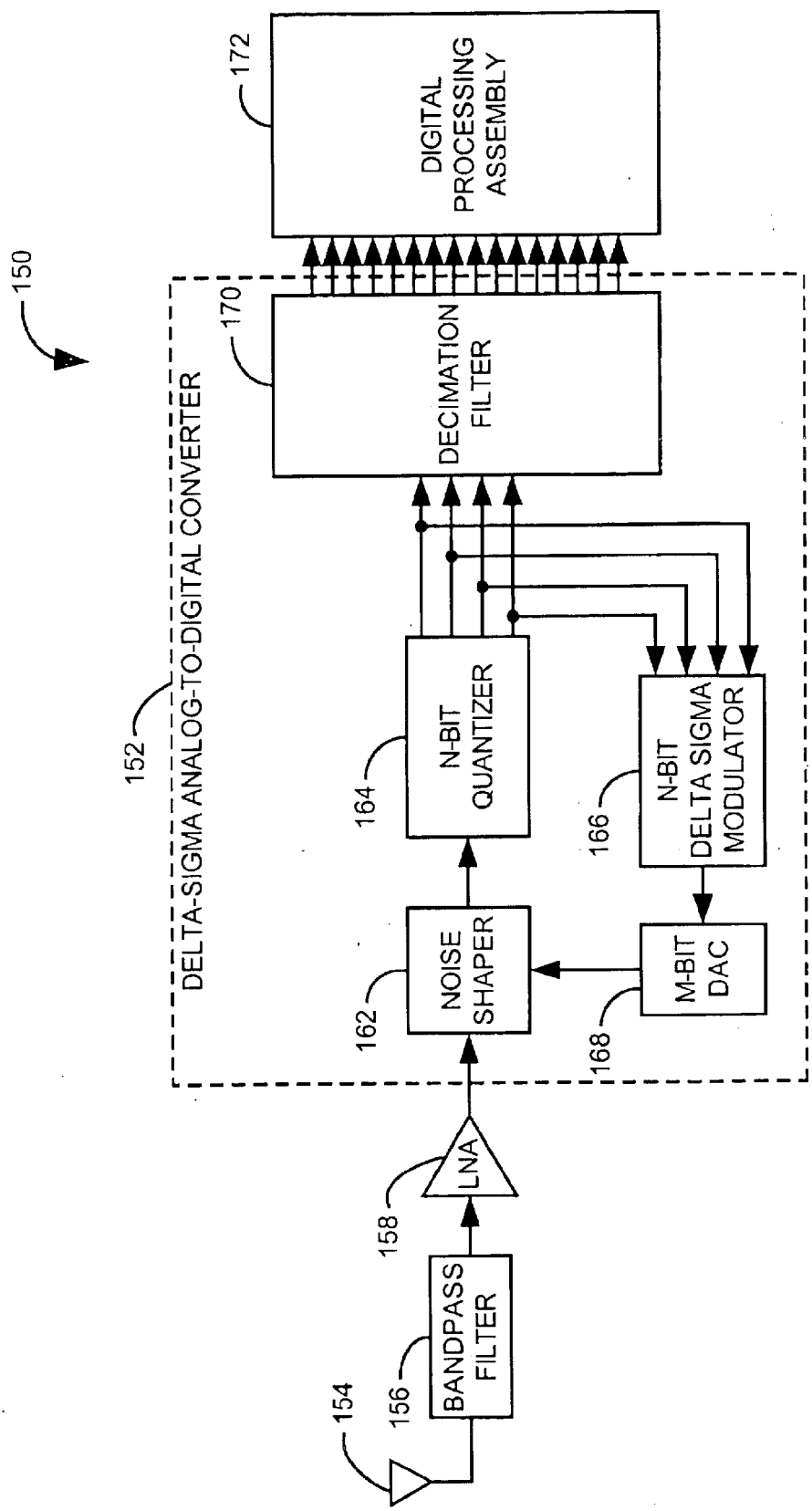
FIG. 4 illustrates an exemplary receiver assembly incorporating a delta-sigma analog-to-digital converter in accordance with an aspect of the present invention.

FIG. 4 illustrates an exemplary receiver assembly 150 incorporating a delta-sigma analog-to-digital converter 152 in accordance with an aspect of the present invention. A radio frequency signal is received at an antenna 154, where it is translated into an analog electrical signal. The analog signal is passed to a bandpass filter 156 which attenuates signals outside of one or more desired passbands to remove interference noise from the signal.

In an exemplary embodiment, the bandpass filter 156 can be a tunable or selectable filter. In other words, the filter 156 can be adjusted electrically to select a center frequency for each of one or more passbands either from a plurality of discrete frequencies or from a continuous range of frequency values. For example, the filter 156 can be a surface acoustic wave (SAW) filter capable of frequency adjustment through electrically actuatable micromechanical structures. The filter 156 can be electrically adjusted via a control signal from a frequency control (not shown) to attenuate undesired carrier frequencies in the multi-carrier signal, while passing desired carrier signals for the antenna path.

The filtered carrier signals are provided to a low-noise amplifier 158. The low-noise amplifier 158 amplifies the signal to an appropriate level for processing and provides the amplified signal to the delta-sigma analog-to-digital converter (ADC) 152. The signal is received within the ADC 152 at a noise shaper 162. The noise shaper 162 preprocesses the signal as to shift quantization noise from an associated quantizer 164 into unused frequency bands. The noise shaper 162 utilizes an analog feedback signal in preprocessing the signal. The preprocessed signal is then provided to the quantizer 164, which produces a multi-bit digital representation of the shaped signal.

The digital signal is provided to a delta-sigma modulator 166 as part of a feedback loop. The delta-sigma modulator 166 produces a digital output signal, which can have an increased sample rate and has a reduced word-size. Along with reducing the associated word-size of the digital signal, the delta-sigma modulator 166 shifts the resulting quantization noise into frequencies such that when combined with the incoming analog signal fall outside of one or more bands of interest. The output of the delta-sigma modulator is provided to a digital-to-analog converter (DAC) 168. The DAC 168 converts the output of the delta-sigma modulator into an analog signal. This analog signal is provided to the noise shaper 162 as the analog feedback signal.

The multi-bit digital output signal is also provided to a decimation filter 170. The decimation filter 170 averages the output of the delta-sigma ADC 152 over a period of time to produce high resolution digital samples of the original analog signal at a desired sample rate lower than the sample rate of the delta-sigma ADC 152. The decimation filter can also include a low-pass filter that filters out the quantization noise produced by the ADC 152. The high-resolution digital signal is provided to a digital processing assembly 172 for further processing. The digital processing assembly can include suitable digital processing components for extracting information from a received signal, including filters, decoders, equalizers, despreaders, and demodulators.

Figure 5:
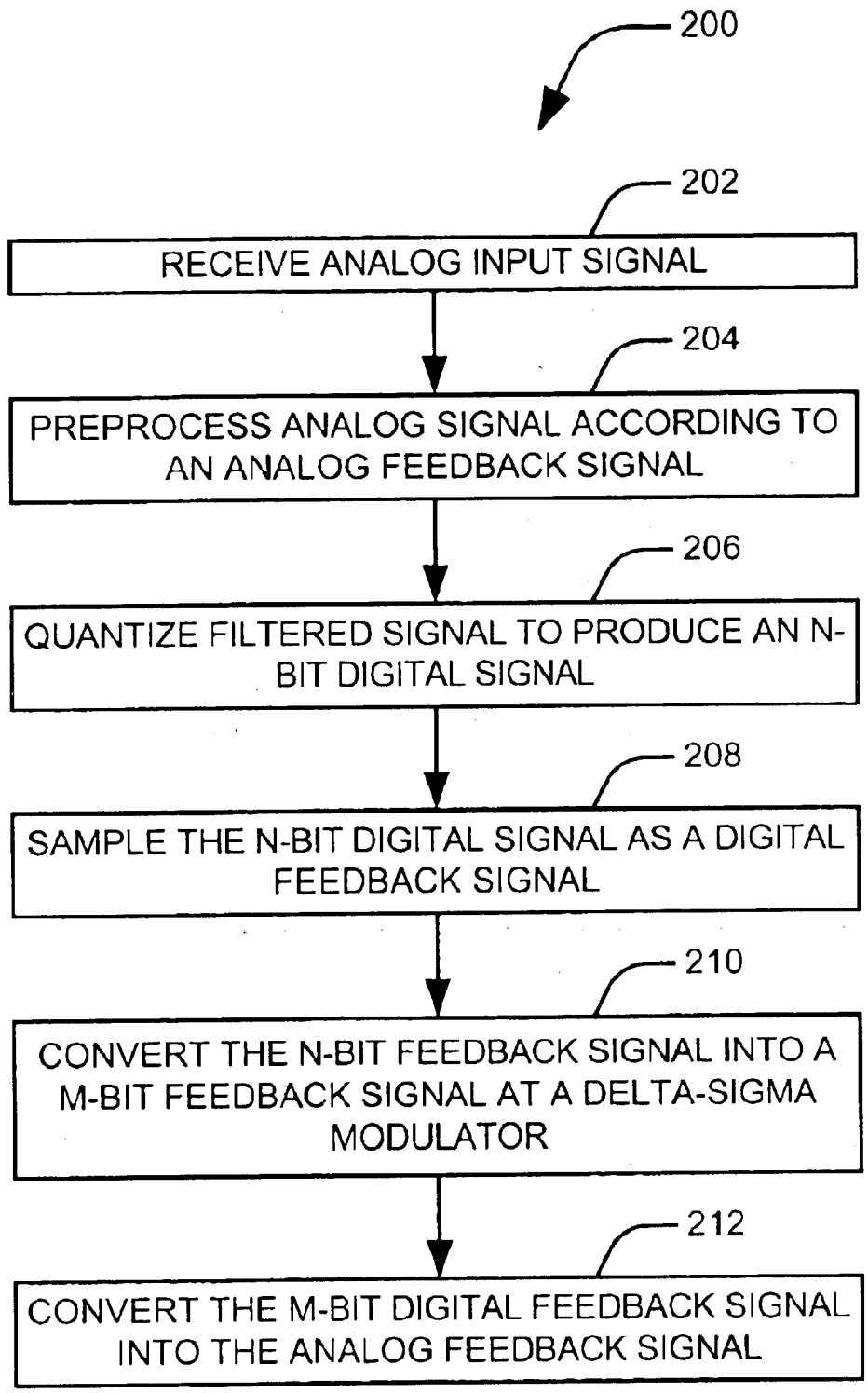
FIG. 5 illustrates a methodology for providing a linear feedback signal within a delta-sigma analog-to-digital converter in accordance with an aspect of the present invention.
Figure 6:
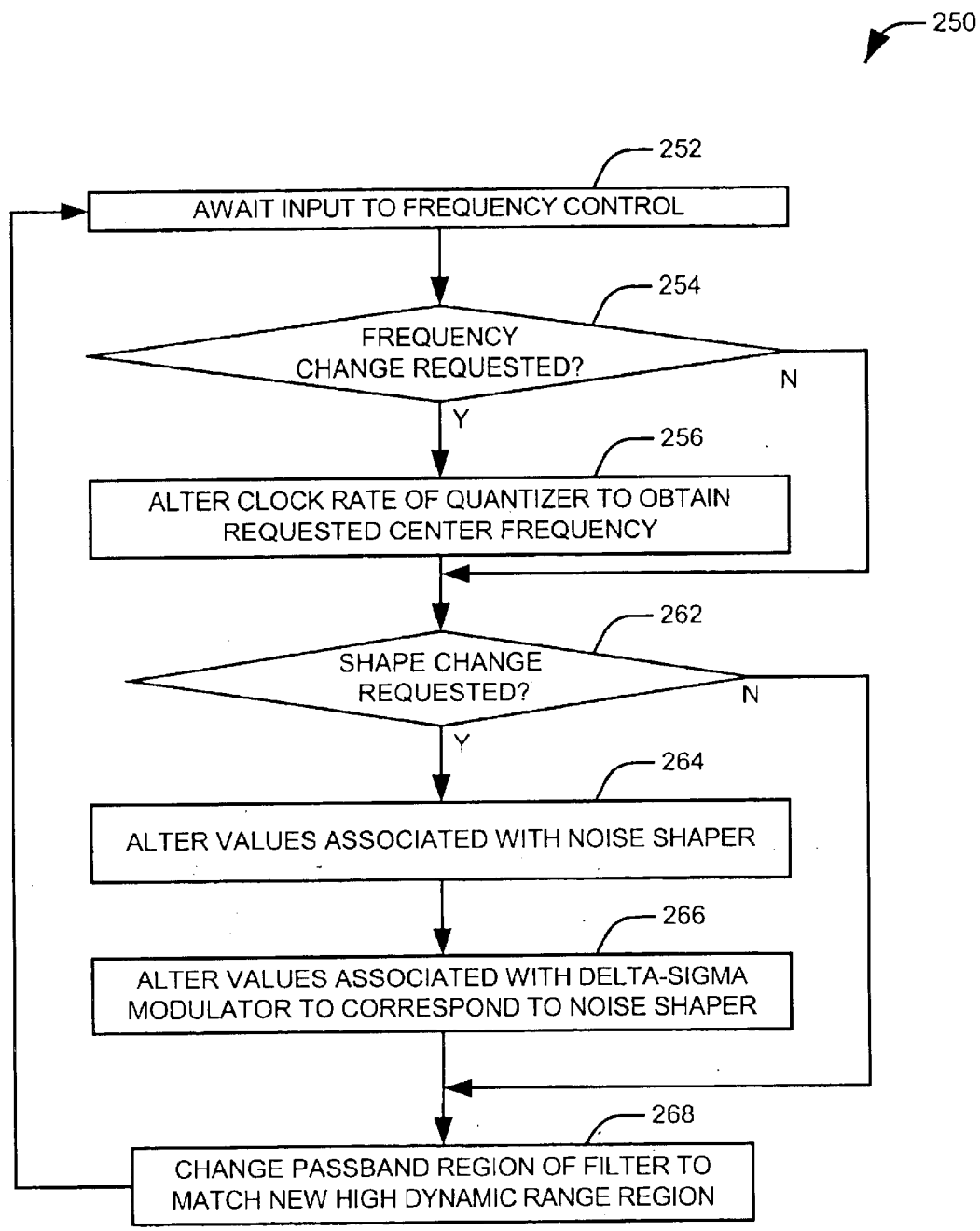
FIG. 6 illustrates a methodology for changing one or more characteristic frequencies associated with a delta-sigma analog-to-digital converter in accordance with an aspect of the present invention.

In view of the examples shown and described above, methodologies in accordance with the present invention will be better appreciated with reference to the flow diagrams of FIGS. 5 and 6. While, for purposes of simplicity of explanation, the methodologies are shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodologies can be implemented in hardware (e.g., one or more integrated circuits), software (e.g., running on a DSP or ASIC) or a combination of hardware and software.

FIG. 5 illustrates a methodology 200 for providing a linear feedback signal within a delta-sigma analog-to-digital converter in accordance with an aspect of the present invention. The methodology begins at 202 where an analog input signal is provided to the delta-sigma analog-to-digital converter. At 204, the analog signal is preprocessed to shift the quantization noise from the analog-to-digital conversion away from one or more frequency bands of interest. For example, this preprocessing can include determining the difference between the analog signal and an analog feedback signal and recording a cumulative sum of the difference.

At 206, the preprocessed signal is quantized to produce an N-bit digital signal. The N-bit digital signal represents the original analog signal, such that a value of the original analog signal can be recovered by averaging the N-bit digital signal over a period of time. At 208, the N-bit digital signal is provided to a feedback loop within the delta-sigma ADC. The feedback loop includes a delta-sigma modulator. At 210, the delta-sigma modulator converts the N-bit feedback signal into an M-bit signal. The quantization noise from this conversion is shifted away from one or more frequency bands of interest as part of the delta-sigma modulator. The M-bit signal is provided to a digital-to-analog converter component at 212, where it is converted into an analog feedback signal. This feedback signal can be used to preprocess successive signals.

FIG. 6 illustrates a methodology 250 for changing one or more characteristic frequencies associated with a delta-sigma analog-to-digital converter in accordance with an aspect of the present invention. The methodology begins at 252, where the system awaits an input to a frequency control. This input can originate from any of a number of sources, including, for example, configuration data from a user or an automated configuration message generated by signal processing components (not shown) upstream of the analog-to-digital converter (ADC).

When the input is received, the system determines at 254 if it is necessary to change the center frequency of one or more narrow low-noise frequency bands associated with the delta-sigma ADC. If so, the clock rate associated with a quantizer within the delta-sigma ADC is altered at 256 if the clock rate is altered it may be necessary to similarly alter the clock rate of either or both of any sample and hold and a clock rate associated with the feedback loop.

If no change to the center frequency is necessary, the methodology proceeds directly to step 262. At 262, the system determines if it is necessary to change the position and/or number of zeroes of a transfer function associated with the noise shaper. By changing the location and number of zeros, the width and effective dynamic range of the frequency bands can be increased or decreased. If so, the methodology advances to 264, where one values associated with the noise shaper in the delta-sigma ADC are altered to produce low-noise frequency bands of the desired shape. At 266, one or more values associated with a delta-sigma modulator in the feedback loop are changed to produce low-noise bands corresponding with those produced by the noise shaper. The methodology then advances to 268.

If it is not necessary to change the shape of the low-noise frequency bands, the methodology advances directly to 268. At 268, one or more filters associated with the delta-sigma ADC are configured such that one or more passbands associated with the filter coincide with the low-noise frequency bands of the ADC. The filters can include an analog matching filter inside the ADC, one or more digital decimation filters that filter and reconstruct the ADC output, and one or more analog filters preceding the ADC in a signal path. The configuration can include changing the center frequency of the filter passbands as well as changing their effective width. Once the filter passbands have been configured, the methodology returns to 252 to await further configuration input at the frequency control.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An analog-to-digital converter assembly, comprising:
   a noise shaper that preprocesses an analog input signal according to an analog feedback signal and an associated transfer function;
   a quantizer that converts the preprocessed analog input signal into a digital output signal;
   a delta-sigma modulator that quantizes the digital output signal to produce a digital feedback signal; and
   a digital-to-analog converter that converts the digital feedback signal into an analog signal to provide the analog feedback signal.

2. The assembly of claim 1, further comprising a frequency control that alters at least one frequency characteristic of at least one low-noise frequency band associated with the analog-to-digital converter.

3. The assembly of claim 2, the frequency control being operatively connected to the noise shaper and the delta-sigma modulator and operative to alter respective bandwidths associated with the at least one low-noise frequency band.

4. The assembly of claim 2, the frequency control being operatively connected to the quantizer and the digital-to-analog converter and operative to alter respective center frequencies associated with the at least one low-noise frequency band.

5. The assembly of claim 1, the noise shaper comprising a filter that attenuates noise introduced by the analog feedback signal.

6. The assembly of claim 5, the filter comprising a tunable filter.

7. The assembly of claim 6, the tunable filter comprising at least one micromechanical structure that can be electrically configured to change the center frequency of at least one passband associated with the filter.

8. The assembly of claim 1, the delta-sigma modulator comprising a quantizer that reduces a N-bit input into an M-bit output, where N is an integer greater than 1, and M is a positive integer less than N.

9. The assembly of claim 8, the delta-sigma modulator comprising a quantizer that reduces an N-bit input into an 1-bit output.

10. The assembly of claim 1, the digital-to-analog converter comprising a single-bit digital to analog converter.

11. A method of providing an analog feedback signal in a multi-bit delta-sigma analog-to-digital converter, comprising:

generating a digital output signal, having a first word-size, from an analog input signal;

preprocessing the digital output signal to shift quantization noise associated with the signal away from at least one frequency band of interest;

quantizing the preprocessed digital output signal into a digital feedback signal having a second word-size, the first word-size being larger than the second word-size; and converting the digital feedback signal into the analog feedback signal.

12. A method as set forth in claim 11, the generation of a digital output signal comprising:

preprocessing the analog input signal to shift quantization noise associated with the analog-to-digital converter according to the analog feedback signal; and quantizing the preprocessed analog signal to produce the digital output signal.

13. A method as set forth in claim 12, the generation of a digital output signal further comprising filtering the preprocessed analog signal to attenuate quantization noise associated with the analog feedback signal.

14. A method as set forth in claim 11, the second word-size being one-bit.

15. A method as set forth in claim 11, the method further comprising changing at least one frequency characteristic of the at least one frequency band of interest.

16. A system for providing feedback within a delta-sigma analog-to-digital converter, comprising:

means for generating an N-bit digital output signal from an analog input signal, where N is an integer greater than one;

means for delta-sigma modulating the N-bit digital output signal to produce an M-bit digital feedback signal, where M is a positive integer less than N; and means for converting the M-bit digital feedback signal into an analog feedback signal.

17. A system as set forth in claim 16, further comprising means for altering at least one frequency characteristic of the means for generating.

18. A system as set forth in claim 16, the means for delta-sigma modulating including means for producing a one-bit digital signal from the N-bit digital feedback signal.

19. A system as set forth in claim 16, the means for generating a digital signal comprising means for quantizing an analog input signal and means for attenuating quantization noise associated with the means for quantizing an analog signal within a frequency band of interest.

20. A system as set forth in claim 19, the means for generating comprising means for attenuating noise associated with the analog feedback signal.

21. A method as set forth in claim 11, wherein the quantizing of the preprocessed digital output signal into a digital feedback signal is performed by a delta-sigma modulator.

22. A system as set forth in claim 16, the means for delta-sigma modulating comprising means for shifting quantization noise away from a frequency band of interest.

* * * * *